United States Patent
Wang et al.

(10) Patent No.: US 11,881,548 B2
(45) Date of Patent: Jan. 23, 2024

(54) ELECTRONIC DEVICE, SEMICONDUCTOR DEVICE, PACKAGING STRUCTURE, BRACKET AND METHOD OF MANUFACTURING THE BRACKET

(71) Applicant: SONGSHAN LAKE MATERIALS LABORATORY, Dongguan (CN)

(72) Inventors: Weiyun Wang, Guangdong (CN); Xinqiang Wang, Guangdong (CN); Yongde Li, Guangdong (CN); Houjin Wang, Guangdong (CN); Junjie Kang, Guangdong (CN); Ye Yuan, Guangdong (CN); Wei Luo, Guangdong (CN)

(73) Assignee: SONGSHAN LAKE MATERIALS LABORATORY, Dongguan (CN)

( * ) Notice: Subject to any disclaimer, the term of this patent is extended or adjusted under 35 U.S.C. 154(b) by 404 days.

(21) Appl. No.: 17/282,001

(22) PCT Filed: Nov. 24, 2020

(86) PCT No.: PCT/CN2020/131218
§ 371 (c)(1),
(2) Date: Apr. 1, 2021

(87) PCT Pub. No.: WO2022/000962
PCT Pub. Date: Jan. 6, 2022

(65) Prior Publication Data
US 2022/0165926 A1    May 26, 2022

(30) Foreign Application Priority Data
Jun. 29, 2020 (CN) ............................ 202010612069

(51) Int. Cl.
*H01L 33/64* (2010.01)
*H01L 33/62* (2010.01)

(52) U.S. Cl.
CPC .............. *H01L 33/62* (2013.01); *H01L 33/64* (2013.01); *H01L 2933/0033* (2013.01)

(58) Field of Classification Search
None
See application file for complete search history.

(56) References Cited

U.S. PATENT DOCUMENTS

| 2013/0121007 A1* | 5/2013 | Yu ........................ H05K 1/183 |
| --- | --- | --- |
| | | 362/382 |
| 2017/0141274 A1 | 5/2017 | Nam et al. | |

FOREIGN PATENT DOCUMENTS

| CN | 202384394 U | 8/2012 |
| --- | --- | --- |
| CN | 103137831 A | 6/2013 |
| CN | 106783755 A | 5/2017 |

OTHER PUBLICATIONS

The State Intellectual Property Office of People's Republic of China, First Office Action and Search Report (with English translation), Chinese Patent Application No. 2020106120695, 10 pages (dated Dec. 31, 2020).

* cited by examiner

*Primary Examiner* — William C Trapanese
(74) *Attorney, Agent, or Firm* — Thompson Hine LLP

(57) ABSTRACT

An electronic device, a semiconductor device, a packaging structure, a bracket and a method for manufacturing the bracket, belonging to the field of semiconductor device packaging. The bracket includes a first frame and a second frame placed opposite to each other and connected through an electroplating layer. In the above, the first frame and the second frame are both ceramic-based and formed with a metal layer on a surface. The bracket has a longer service life.

20 Claims, 7 Drawing Sheets

US 11,881,548 B2

ELECTRONIC DEVICE, SEMICONDUCTOR DEVICE, PACKAGING STRUCTURE, BRACKET AND METHOD OF MANUFACTURING THE BRACKET

CROSS-REFERENCE TO RELATED APPLICATION

This application is a national stage filing of International Patent Application No. PCT/CN2020/131218 filed on Nov. 24, 2020, which in turn claims priority to Chinese patent application with the filing number 202010612069.5 filed on Jun. 29, 2020 with the Chinese Patent Office, and entitled "Electronic Device, Semiconductor Device, Packaging Structure, Bracket and Method of Manufacturing the Bracket." The contents of both of these applications are incorporated herein by reference in entirety.

TECHNICAL FIELD

The present disclosure relates to the field of semiconductor device packaging, in particular, to an electronic device, a semiconductor device, a packaging structure, a bracket and a method of manufacturing the bracket.

BACKGROUND

A deep ultraviolet light emitting diode (UV-C LED for short) refers to a light emitting diode having a light emitting central wavelength of less than 400 nm.

In a packaging structure of UV-C LED, a bracket structure composed of an insulating substrate and an insulating dam is usually used to place a light-emitting ultraviolet diode chip, and then an optical lens and the dam are bonded through packaging glue or soldered through a welding material, so that the optical lens and the bracket structure together form a closed space therebetween, and thereby protect the ultraviolet light emitting diode chip therein.

However, the UV-C LED of the above packaging structure often exhibits a relatively short service life during use.

SUMMARY

In order to solve the problem of short service life of the UV-C LED, the present disclosure provides an electronic device, a semiconductor device, a packaging structure, a bracket and a method of manufacturing the bracket.

The present disclosure can be achieved as follows.

In a first aspect, an example of the present disclosure provides a bracket for semiconductor device packaging. The bracket includes a first frame, an electroplating layer and a second frame which are sequentially distributed in a laminated manner.

In the above, the first frame includes a first ceramic matrix and a first metal cladding layer on a surface thereof. The second frame placed opposite to the first frame includes a second ceramic matrix and a second metal cladding layer on a surface thereof. The electroplating layer is located between the first frame and the second frame that are placed opposite to each other, and connected to the first metal cladding layer and the second metal cladding layer by electroplating, respectively.

In this bracket structure, as the first frame and the second frame both adopt the matrix made of a ceramic material, the two have a relatively appropriate matching relationship of coefficients of thermal expansion, so that they can withstand certain high temperatures. Meanwhile, as the first frame and the second frame are connected by electroplating, the connection is solid and stable, and problems such as thermal damage caused by the welding manner can be avoided.

Optionally, the bracket includes any one or more of the following situations:

a first situation, the thickness of the first ceramic matrix is between 0.2 mm and 1.5 mm;

a second situation, the thickness of the second ceramic matrix is less than or equal to 1.0 mm;

a third situation, the coefficient of thermal expansion of the first frame is consistent with or close to the coefficient of thermal expansion of the second frame;

a fourth situation, the bracket has an operating duration more than or equal to 5 minutes under a condition that an operating temperature reaches 250° C. to 400° C.;

a fifth situation, the bracket is capable of continuously operating in an environment of alternate high and low temperatures with a temperature difference of 50~200° C.;

a sixth situation, the first metal cladding layer and the second metal cladding layer are both flat or uneven, and/or the first ceramic matrix and the second ceramic matrix are separately configured to be flat or uneven, respectively; and a seventh situation, a metal material between the first ceramic matrix and the second ceramic matrix includes the first metal cladding layer, the second metal cladding layer and an electroplating metal layer, and the total thickness of the metal material is not more than 100 μm.

Optionally, a spacer is provided between the first metal cladding layer and the second metal cladding layer; alternatively, the spacer is located between the first metal cladding layer and the electroplating layer; and/or the thickness of the spacer is less than 80 μm; and/or the thickness of the spacer is less than 70 μm; and/or the material of the spacer is metal or non-metal; or the spacer is bonded into the electroplating layer.

Optionally, the first metal cladding layer and the second metal cladding layer are connected by electroplating directly through the electroplating layer.

Optionally, the bracket has an electroplating electrode, and the electroplating electrode is electrically connected to the electroplating layer; alternatively, the bracket has an electroplating electrode bonded to the second ceramic matrix, the second ceramic matrix has a through hole, a conductive post filled in the through hole, and the electroplating electrode is electrically connected to the electroplating layer through the conductive post.

Optionally, the bracket has an electroplating electrode bonded to the second ceramic matrix, the second ceramic matrix has two electroplating through holes, and two conductive posts respectively filled in the two electroplating through holes, and the electroplating electrode is electrically connected to the electroplating layer through the two conductive posts; and the second ceramic matrix has a positive electrode and a negative electrode, the positive electrode has a positive through hole, the negative electrode has a negative through hole, and a connecting line between the positive through hole and the negative through hole is orthogonal to a connecting line between the two electroplating through holes or forms an inclined angle with the connecting line of the positive and negative electrodes;

alternatively, the electroplating electrode is located at an edge of the second ceramic matrix.

Optionally, the material of the first ceramic matrix and the material of the second ceramic matrix are respectively independently any one selected from the group consisting of aluminum nitride, aluminum oxide, zirconium oxide, beryllium oxide, silicon carbide, boron nitride, silicon nitride, and zirconium oxide toughened aluminum oxide ceramic.

In a second aspect, an example of the present disclosure provides a method for manufacturing a bracket for semiconductor device packaging, In one case the method includes: providing a ceramic substrate, wherein a surface of the ceramic substrate is plated with a first metal plating layer, and a surface layer material of the first metal plating layer is copper, nickel, gold or silver; providing a ceramic enclosing plate, wherein a surface of the ceramic enclosing plate is plated with a second metal plating layer, and a surface layer material of the second metal plating layer is copper, nickel, gold or silver; and electroplating the ceramic substrate and the ceramic enclosing plate with copper, nickel, gold or silver in an alignment fit state so as to form an electroplating layer between the first metal plating layer and the second metal plating layer to connect the two.

Optionally, the alignment fit between the ceramic substrate and the ceramic enclosing plate is realized in a manner of bringing the first metal plating layer and the second metal plating layer into partial contact; alternatively, a surface layer material of the first metal plating layer is copper, nickel, gold or silver, or a surface layer material of the second metal plating layer is copper, nickel, gold or silver.

Optionally, the alignment fit between the ceramic substrate and the ceramic enclosing plate is realized in a manner of bringing the first metal plating layer and the second metal plating layer close to each other to a given distance and providing a spacer between the first metal plating layer and the second metal plating layer, the given distance is within 80 mm or 70 mm; alternatively, the spacer is in contact with one or both of the first metal plating layer and the second metal plating layer; alternatively, the spacer is not in contact with the first metal plating layer and the second metal plating layer.

Optionally, a method of providing the ceramic substrate includes: manufacturing a first electroplating electrode having a protrusion on a surface of the first metal plating layer; providing a first conductive post penetrating through the ceramic substrate; and providing a second electroplating electrode on the ceramic substrate, so as to be in electrical communication with the first electroplating electrode through the first conductive post.

Optionally, the method of providing the ceramic substrate includes: manufacturing a first chip power supply electrode for electrical connection with a semiconductor device on the surface of the ceramic substrate; providing a chip power supply conductive post penetrating through the ceramic substrate; and providing, on the ceramic substrate, a second chip power supply electrode that is in electrical communication with the first chip power supply electrode through the chip power supply conductive post.

Optionally, after the step of electroplating, the method includes: a step of cutting a dam; alternatively, a step of cutting a dam, wherein the step of cutting is realized by means of laser or mechanical cutting; alternatively, a step of cutting a dam, wherein after the dam is cut, electroplating is performed so as to enhance electroplating connection strength between the first metal plating layer and the second metal plating layer.

Optionally, copper, nickel, gold or silver is electroplated in the alignment fit state of the ceramic substrate and the ceramic enclosing plate, and in the step of electroplating, an electroplating energizing mode includes: providing an electroplating electrode on a surface of the ceramic enclosing plate facing to the ceramic substrate and supplying power by the electroplating electrode to perform electroplating; alternatively, providing an electroplating electrode on a surface of the ceramic substrate facing to the ceramic enclosing plate and supplying power by the electroplating electrode to perform electroplating; alternatively, providing an internal electroplating electrode and an external electroplating electrode electrically connected with each other on the ceramic substrate, and supplying power by the external electroplating electrode to perform electroplating, wherein the internal electroplating electrode is located on the surface of the ceramic substrate facing to the ceramic enclosing plate, and the external electroplating electrode is located on the surface of the ceramic substrate facing away from the ceramic enclosing plate.

Optionally, after the second component is cut, the electroplating continues so as to enhance electroplating connection between the first metal plating layer and the second metal plating layer.

In a third aspect, an example of the present disclosure provides a packaging structure, which includes the above bracket or the bracket manufactured according to the above method, a semiconductor chip fixed to the bracket; and a transparent material covering and fixed to the bracket.

In a fourth aspect, an example of the present disclosure provides a semiconductor device, including the above packaging structure.

Optionally, the semiconductor device includes an ultraviolet light emitting diode.

In a fifth aspect, an example of the present disclosure provides an electronic device, which includes the above packaging structure.

In the above implementation process, the bracket provided in the embodiments of the present disclosure has the advantage of easy manufacture, and it can withstand relatively high operating temperatures or process temperatures (for example, 350° C.).

BRIEF DESCRIPTION OF DRAWINGS

In order to more clearly illustrate technical solutions of embodiments of the present disclosure, accompanying drawings which can be used in the embodiments will be introduced briefly below, and it should be understood that the accompanying drawings below merely show some embodiments of the present disclosure, therefore, they should not be considered as limitation on the scope, and those ordinarily skilled in the art still could obtain other relevant accompanying drawings according to these accompanying drawings, without using any inventive efforts.

REFERENCE SIGNS

Figure 1:
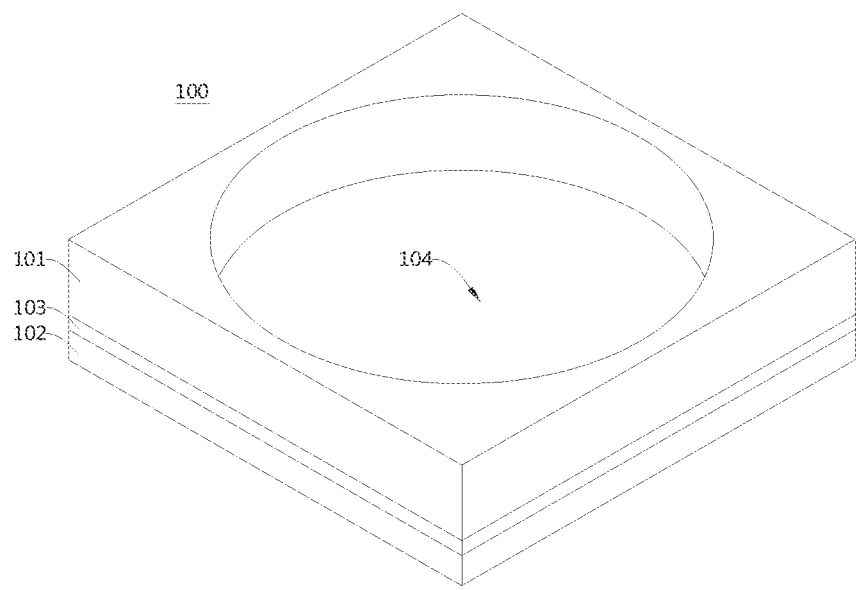
FIG. 1 is a structural schematic view of a first type of bracket provided in an example of the present disclosure.

100—bracket; 100*a*—bracket; 100*b*—bracket; 101—first frame; 1011—first ceramic matrix; 1012—first metal cladding layer; 102—second frame; 1021—second ceramic matrix; 1022—second metal cladding layer; 103—electroplating layer; 104—cavity; 201—ceramic substrate; 202—first electrode; 203—second electrode; 204—conductive post; 205—protrusion; 301—first internal electrode; 302—second internal electrode; 303—positive electrode; 304—negative electrode; 305—conductive connecting post; 900—narrow slit.

DETAILED DESCRIPTION

The packaging structure of deep ultraviolet light emitting diode mainly includes a bracket, a light emitting chip/diode chip and an optical lens. In the above, the semiconductor device—the light emitting chip—is a main structure of the deep ultraviolet light emitting diode. The light emitting chip is supported by the bracket and packaged by a lens structure, so as to protect the light emitting chip, and improve the light output ratio.

In researches, the inventors have found that in the bracket of the light emitting diode, a substrate is connected to a dam through packaging glue (epoxy resin or silicone) to form a space for placing the diode chip. However, the packaging glue with good adhesiveness has poor heat resistance, and cannot withstand the high packaging eutectic process temperature that is up to 350° C., and the high-temperature resistant glue has poor adhesiveness, and cannot ensure the sealing property and structural strength of the dam body, moreover, the packaging glue is quite easily aged in an ultraviolet environment.

In view of the above problems, it may be possible to try to modify components of the packaging glue, but this is not easy to implement. In some practices, in order to avoid the shortcomings brought about by the packaging glue, the dam in the bracket adopts a metal material. For example, the bracket is formed by a copper dam and the substrate. In this solution, the copper dam may be connected to the substrate by welding; alternatively, in this solution, the copper dam is formed on the substrate by electroplating thick copper. As the copper dam can ensure the sealing property, and does not need to use the packaging glue, the performance of packaging may be improved to a certain extent and the service life may be extended. Meanwhile, an adhesive force between the metal plating layer and the ceramic substrate is also better.

Although the above solution using the copper dam has the above advantages, the metal dam is not matched with the ceramic substrate in the coefficient of thermal expansion. When the LED operates for a long period of time, the change of high and low temperatures will cause the ceramic substrate to break, which affects the reliability of the LED.

In order to overcome the stress generated between materials having mismatched coefficients of thermal expansion caused by the temperature, the inventors believe that the thickness of the ceramic substrate may be increased (for example, being at least 0.5 mm or more). However, in further researches, with the increase of thickness of the ceramic substrate, the thermal resistance will also be larger, thus resulting in unfavorable heat dissipation effect.

Meanwhile, due to the problem of stress, the thickness of the metal dam cannot be too thick, usually being 0.5 mm. In other words, the space of this kind of bracket for placing the packaged device is very small and the selectivity is narrow, thus the types of packaged devices (such as light emitting chip/diode chip) are also limited.

In addition, when the metal dam is formed on the ceramic substrate using a process such as brazing or diffusion welding, the processing temperature is high, the degree of resistance of the metal layer (metal dam, such as copper dam) is relatively poor, and the processing duration is relatively long, thus resulting in high processing costs.

In short, various existing light emitting diodes mainly have the following problems.

1) The expansion coefficients of the ceramic substrate and the metal dam are not matched. The stress of the ceramic substrate is large, and the temperature change during the use of the diode has the risk of breaking the ceramic substrate, and meanwhile, the long-term high and low temperature operating environment will seriously affect the reliability.

2) The ceramic substrate must be made thick (0.5 mm or more) to resist the stress caused by the mismatch of expansion coefficients, but the thicker the ceramic substrate is, the greater the thermal resistance thereof is, thus causing poor heat dissipation effect.

3) The high-viscosity packaging glue is not resistant to high temperature, and the high-temperature-resistant packaging glue is not high in viscosity, resulting in low structural strength of the dam mounted through the packaging glue; moreover, the packaging glue is not resistant to ultraviolet.

4) The ceramic substrate and the metal dam are connected by brazing, however, the processing temperature of brazing is too high, then the circuit layer of the ceramic substrate is easily damaged by a too high processing temperature.

5) The ceramic substrate and the metal dam are connected by diffusion welding, but the same as brazing, the processing temperature of the diffusion welding is too high, which easily causes damage to the circuit layer of the ceramic substrate, and meanwhile, the implementation costs of the diffusion welding are high, and the processing duration is too long.

6) The process of forming the metal dam on the ceramic substrate by an electroplating process needs to prepare a plurality of connecting layers, circuit layers or metal layers between the ceramic substrate and the metal dam, so that the manufacturing process is complex, and the manufacturing costs are high.

In view of this, the inventors attempted to partially or completely overcome, even solve the above problems. For example, the inventors wish to achieve good balance and synchronous improvement in the manufacturing process and quality of the deep ultraviolet light emitting diode.

Based on such needs, the inventors innovatively proposed, upon researches, that a bracket 100 of a diode is constructed of double layers of ceramic, and double layers of ceramic is connected through an electroplating operation. Although the bracket 100 is illustrated and described based on a light emitting diode in an example of the present disclosure, this is not intended to limit that the bracket 100 proposed in the present disclosure and corresponding application thereof can only be limited to deep ultraviolet light emitting diodes. In fact, it may also be applied to packaging of devices such as power electronics devices, for example, insulate-gate bipolar transistor (IGBT for short), laser diode (LD for short), and photo-diode (PD for short).

Due to the use of the same type of material (ceramic), compared with the bracket 100 constructed of different kinds of materials (such as ceramic and metal), the coefficient of thermal expansion of the bracket 100 constructed of double layers of ceramic is better matched, and may effectively control the excessive stress and mismatch caused by cold and hot impact and problems caused thereby (such as bracket warpage, layering). Meanwhile, as the double layers of ceramic is connected by electroplating, and the electroplating does not need a high-temperature condition, the requirement to the thermal resistance of the circuit layer is low, and thermal damage is not easily generated, either. Moreover, the electroplating process is simple in operation and easy to implement, then the manufacturing cycle and costs of the bracket 100 may be reduced.

It is verified through experiments that the bracket 100 manufactured using the above solution of the present disclosure is capable of withstanding high temperatures for more than 2 hours. Exemplarily, the bracket 100 can normally operate under a condition with an operating temperature of 250° C.-400° C. for 5 minutes or more, even 30 minutes or more, and still further can normally operate under a condition with an operating temperature of 350° C. for 30 minutes or more. Moreover, the bracket can continuously operate in an environment with alternate high and low temperatures with a temperature difference of 50~200° C. Exemplarily, the bracket is capable of withstanding thermal shock of high and low temperatures (with the temperature difference of 200° C.) at 150° C. and −50° C. By contrast, the bracket bonded through the packaging glue is resistant to the temperature of not more than 260° C., and the dam grown by electroplating copper has poor thermal shock resistance under the condition of alternate high and low temperatures.

When the double layers of ceramic is selected, materials of the double layers of ceramic may be the same or different from each other, and may be selected according to use situation. Specific components of the ceramic may be materials such as aluminum nitride, aluminum oxide, zirconium oxide, beryllium oxide, silicon carbide, boron nitride, silicon nitride, zirconium oxide toughened aluminum oxide ceramic (ZTA for short), or other known ceramic. Compared with different kinds of materials (ceramic and metal), both are the same kind of material (ceramic), therefore the coefficients of thermal expansion are better matched. Therefore, when the specific material of the double layers of ceramic is selected, the degree of matching of coefficients of thermal expansion may be further investigated, and the coefficients of thermal expansion of the two may be equal or close to each other. In addition, parameters such as density, thermal conductivity and stiffness of the ceramic may also be investigated so as to provide a double-layer ceramic structure of better quality.

In an example of the present disclosure, based on this design, a bracket 100 for packaging a semiconductor device (a diode light emitting chip in an example) is proposed.

Figure 2:
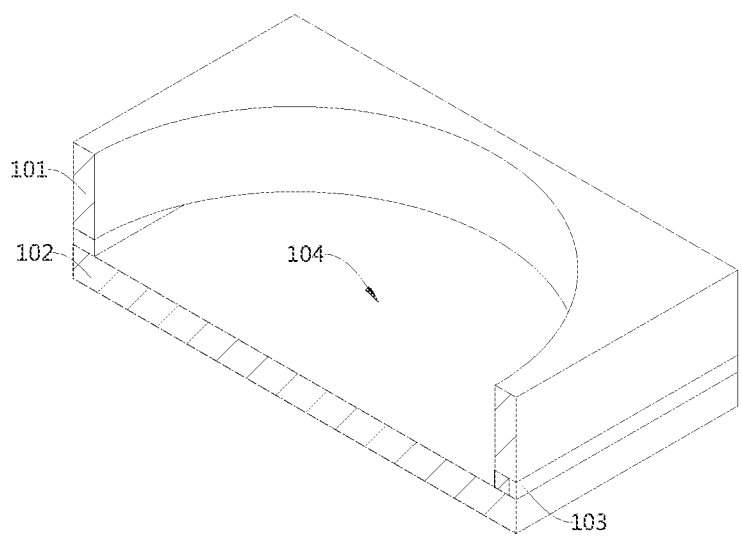
FIG. 2 shows a sectional structural schematic view of the bracket in FIG. 1.

Referring to FIG. 1 and FIG. 2, the bracket 100 is a double-layer structure, and includes a first frame 101 and a second frame 102, and the two are arranged opposite to each other, and are connected by electroplating, therefore, an electroplating layer 103 is formed between the first frame 101 and the second frame 102. The bracket 100 may form a three-dimensional structure containing a cavity for placing various electronic components, such as the diode light emitting chip in an example of the present disclosure. In the embodiment shown in FIG. 1 and FIG. 2, the second frame 102 is a plate-like structure. The first frame 101 may also be a plate-like structure, and the first frame 101 has a cavity 104 or a groove or a hole used as a space for accommodating electronic components. In the embodiment shown in FIG. 1 and FIG. 2, the cavity 104 penetrates through the first frame 101 in the thickness direction of the first frame 101, therefore, the first frame 101 and a surface of the second frame 102 (a flat surface of the second frame 102 at one side in the thickness direction in this embodiment) together form the cavity for accommodating electronic components. It should be understood that, in other optional embodiments, one side of the second frame 102 connected to the first frame 101 also may be not a flat surface, but has a groove, which groove is communicated with the cavity 104 of the first frame 101, so as to accommodate the electronic components together.

Figure 3:
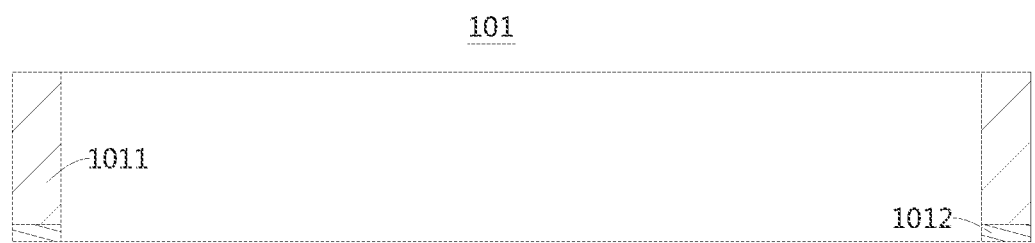
FIG. 3 shows a structural schematic view of a first frame in the bracket in FIG. 1.
Figure 4:
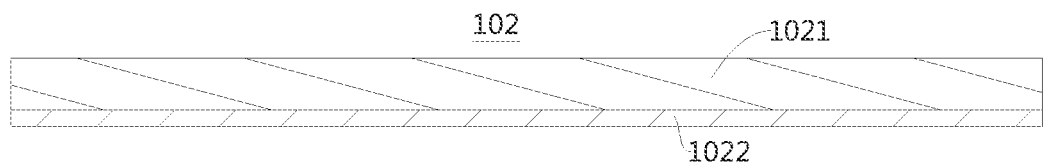
FIG. 4 shows a structural schematic view of a second frame in the bracket in FIG. 1.

Based on the requirements of electroplating, the first frame 101 has a conductive layer, i.e. it includes a first ceramic matrix 1011 and a first metal cladding layer 1012 on a surface thereof; similarly, the second frame 102 also has a conductive layer, i.e. it includes a second ceramic matrix 1021 and a second metal cladding layer 1022 on a surface thereof, with reference to FIG. 3 and FIG. 4.

As the ceramic is a non-conductive non-metal material, the metal cladding layers need to be formed on the surfaces of the first frame 101 and the second frame 102 for subsequent electroplating. A method of manufacturing the metal cladding layer on the non-metal surface may be implemented as follows:

1. performing mechanical roughening (roughening treatment, such as sand paper grinding or sand blasting treatment) on the surface of the non-metal material (hereinafter referred to as workpiece), so as to increase a contact area of electroplating materials when connecting the first frame 101 and the second frame 102 subsequently by electroplating, thereby increasing the bonding strength of the electroplating materials; 2. degreasing the surface of the workpiece; 3.

performing chemical roughening on the surface of the workpiece, for example, corroding the surface of the workpiece with a chemical agent; 4. sensitizing and activating the surface of the workpiece to adhere a layer of readily oxidizable substance (such as $SnCl_2$) on the surface thereof, so as to reduce a catalytic metal such as palladium to a colloidal particle state during the activation process; and 5. performing electroless copper plating or electroless nickel plating under the action of the catalytic metal, so as to form a conductive metal layer, such as a copper layer or a nickel layer, on the surface of the workpiece.

Alternatively, it may also be implemented in the following manner:

1. degreasing the ceramic surface, for example, using an alkaline liquid (such as 30 g/L sodium carbonate); 2. roughening the ceramic surface, such as soaking the ceramic surface with a chemical agent (180 g/L chromic anhydride, sulfuric acid 1000 mL with a relative density of 1.84, water 400 mL); 3. sensitizing the ceramic surface, such as soaking in a sensitizing liquid ($SnCl_2.2H_2O$ 10 g, concentrated hydrochloric acid 40 mL, and water 1000 mL); 4. after washing with pure water, baking and drying; and 5. soaking the ceramic in an aqueous ammonia solution of silver nitrate, subsequently reducing with an aqueous formaldehyde solution, after washing, performing electroless plating to form a thin layer of conductive copper film on the ceramic surface.

Alternatively, a metal slurry is coated on the surface of the ceramic by screen printing, and then dried and sintered at a high temperature (700~800° C.) to form a thin metal layer of 10 to 20 μm. In the above, the metal slurry is mainly composed of components such as metal powder, organic resin, and glass. High-temperature sintering causes the organic resin (adhesive) to be burned away, while pure metal remains; meanwhile, the vitreous substance is adhered to the surface of the ceramic substrate 201.

Alternatively, the ceramic is bonded to copper foil at a high temperature such as 1065° C. by eutectic sintering.

Alternatively, a ceramic sheet having undergone pretreatment is subjected to vacuum sputtering, deposited with a metal (such as titanium and copper) on the surface thereof, and then thickened by electroplating or electroless plating.

Alternatively, the metal cladding layer also may be formed on the surface of the ceramic matrix by other processes known to the inventors or by existing mature processes.

In the first frame 101, the first ceramic matrix 1011 constitutes a main body or a main component thereof, therefore, the thickness of the first ceramic matrix 1011 is larger than that of the first metal cladding layer 1012, for example, the thickness of the first ceramic matrix 1011 is 0.3 mm (millimeter), and the thickness of the first metal cladding layer 1012 is 10 μm (micrometer). By the same reasoning, in the second frame 102, the second ceramic matrix 1021 constitutes a main body or a main component thereof, therefore, the thickness of the second ceramic matrix 1021 is larger than that of the second metal cladding layer 1022.

In an example of the present disclosure, the thickness of the first ceramic matrix 1011 in the first frame 101 may be controlled to be between 0.2 mm and 1.5 mm, for example, 0.4, 0.5, 0.6, 0.7, 0.8, 0.9, 1.0, 1.1, 1.2, 1.3, 1.4, 1.5 mm, or any value within an interval formed by any two thereof. On the other hand, the thickness of the second ceramic matrix 1021 in the second frame 102 may be controlled to be 1.0 mm or less (namely, less than or equal to 1.0 mm), for example, 0.01 mm, 0.1, 0.2, 0.3, 0.4 or 0.5 mm, or any value within an interval formed by any two thereof.

By controlling the thickness of the first ceramic matrix 1011 and the second ceramic matrix 1021 of the bracket 100 as the above, it is possible to avoid the limitation to the thickness due to the mismatch of coefficients of thermal expansion, thereby improving the flexibility in selecting the structure of the bracket 100. For example, the thickness of the first ceramic matrix 1011 is controlled within the above range, without the need of deliberately reducing the thickness (for example, not exceeding 0.5 mm) in order to overcome the thermal stress, so that it may further facilitate the application of the bracket 100 to a variety of structures and dimensions (especially large dimensions, mainly referring to semiconductor devices with relatively large thickness). Meanwhile, the thickness of the second ceramic matrix 1021 is controlled within the above range, without the need of deliberately increasing the thickness (for example, 0.5 mm or more) in order to overcome the thermal stress. In brief, through the solution of the present disclosure, the double ceramic layers and the electroplating connection may effectively avoid limitations to the structure and dimension (such as thickness) of the bracket 100.

In addition, in an example of the present disclosure, the thickness of the electroplating layer 103 connecting the first frame 101 and the second frame 102 may also be appropriately controlled. Obviously, if the thickness of the electroplating layer 103 is too large, more electroplating time and electroplating raw materials are required, and if the electroplating layer 103 is too small, the structure strength and the degree of connection firmness may be hazardous (if the electroplating layer 103 is too thin, it is susceptible to thermal shock and failure or deterioration of connecting function).

Moreover, correspondingly, based on this, the electroplating process of the first frame 101 and the second frame 102 may also be designed correspondingly, for example, when the first frame 101 and the second frame 102 are aligned for electroplating, the two have an appropriate distance to each other, that is, there is a gap/slot between the two. Moreover, the dimension of the slot needs to be reasonably selected, and if the slot is too big, the thickness of the metal material that needs to be electroplated (namely, the thickness of the electroplating layer 103) will increase, then the problem of mismatch of thermal expansion between the electroplating layer 103 and the ceramic (the first ceramic matrix 1011 and the second ceramic matrix 1021) appears; and if the slot is too small, the first ceramic matrix 1011 and the second ceramic matrix 1021 are not easily connected firmly.

The thickness of the electroplating layer 103 may be controlled by an electroplating method. For example, when the first frame 101 and the second frame 102 are connected by electroplating, the two are opposed to each other and the metal cladding layers are in contact. At this time, the thickness of the electroplating layer 103 is relatively small. Alternatively, in some other examples, when the first frame 101 and the second frame 102 are connected by electroplating, the two are opposed to each other and spaced from each other, that is, a clearance is provided between the metal cladding layers of the two, such as the foregoing slot. At this time, the thickness of the electroplating layer 103 is relatively large.

Further, for an example of spacing between two metal cladding layers, the first ceramic matrix 1011 and the second ceramic matrix 1021 may be selected to be separately fixed and controlled to have an appropriate distance (the two metal cladding layers are not in contact) therebetween. The two are not in direct contact, for example, by forming a convex structure on a surface of an electroplating electrode to be mentioned later in the process of manufacturing the bracket, i.e., in the electroplating operation. In other words, the first frame and the second frame are close to each other to have an appropriate distance, so that a gap exists between the first metal cladding layer and the second metal cladding layer. In general, the distance between the first frame and the second frame adjacent to each other may be controlled by the thickness of the clearance between the first ceramic matrix and the second ceramic matrix. For example, the distance between the first ceramic matrix 1011 and the second ceramic matrix 1021 is 100 μm, therefore, the total thickness of the first metal cladding layer 1012, the second metal cladding layer 1022 and the electroplating material electroplated therebetween is 100 μm, and the thickness of each of these three may be appropriately adjusted within the range of 100 μm. The 100 μm thickness therein is the total thickness including two metal cladding layers and the electroplating layer.

Exemplarily, a spacer is placed between the two metal cladding layers, and both metal cladding layers are brought into contact with, or both are not in contact with the spacer, or one of the two metal cladding layers is in contact with the spacer and the other is not in contact with the spacer. Thus, in the example where the spacer is in contact with the two metal cladding layers, the thickness of the spacer is the distance between the two metal cladding layers, that is, the distance between the first frame 101 and the second frame 102. The distance between the first frame 101 and the second frame 102 may be controlled more conveniently and precisely through the spacer, thereby facilitating simplification of the electroplating operation, and optimization of the method of manufacturing the bracket 100. Exemplarily, the thickness of the spacer may be, for example, less than 80 μm, and further, less than 70 μm. The spacer may also be selected from a metal material or a non-metal material.

As described above, the spacer is provided between the first frame 101 and the second frame 102, therefore, in some examples, the spacer is bonded into the electroplating layer 103 by an electroplating operation. Alternatively, the spacer may also be located between the electroplating layer 103 and the first metal cladding layer 1012 of the first frame 101. Alternatively, the spacer may also be located between the electroplating layer 103 and the second metal cladding layer 1022 of the second frame 102. In other words, the first metal cladding layer 1012 of the first frame 101 and the second metal cladding layer 1022 of the second frame 102 are different from the preceding solution in which the first metal cladding layer and the second metal cladding layer are in contact and connection directly through the electroplating layer 103, while the two may also be indirect contact and connection through the spacer or a cushion layer and the electroplating layer 103.

In addition, by controlling the surface topography of the first metal cladding layer 1012 in the first frame 101 and the surface topography of the second metal cladding layer 1022 in the second frame 102, it is also helpful to improve the electroplating connection firmness and effect of the first frame 101 and the second frame 102. In general, the surfaces of the first metal cladding layer 1012 and the second metal cladding layer 1022 may be both flat surfaces, or both are uneven surfaces, or the surface of any one of them is flat and the other is uneven. Further, in addition to selecting the surface topography of the metal cladding layers, the surfaces of the first ceramic matrix 1011 and the second ceramic matrix 1021 may also be controlled, for example, the two are separately configured with flat or uneven surface, respectively. Furthermore, it should be understood that the surface topography (such as flat or uneven) of the ceramic matrix and the surface topography (such as flat or uneven) of the metal cladding layer are independent from each other, and both may be selected and matched to control the surface topography.

In addition, in order to facilitate a person skilled in the art in implementing the structure of the bracket 100 of the present disclosure, the example further provides a method of manufacturing the bracket.

The method of manufacturing the bracket 100 includes:

Step S1, providing a ceramic substrate, wherein a surface of the ceramic substrate is plated with a first metal plating layer, and a surface layer material of the first metal plating layer is copper, nickel, gold or silver.

Step S2, providing a ceramic enclosing plate, wherein a surface of the ceramic enclosing plate is plated with a second metal plating layer, and a surface layer material of the second metal plating layer is copper, nickel, gold or silver.

Step S3, electroplating the ceramic substrate and the ceramic enclosing plate with copper, nickel, gold or silver in an alignment fit state so as to form an electroplating layer between the first metal plating layer and the second metal plating layer to connect the two.

For the requirements of mass production, the manufacturing method may further include step S4 performed after the electroplating step: a cutting step. The cutting step is realized, for example, by means of laser or mechanical cutting. That is, both the ceramic substrate and the ceramic enclosing plate are arranged or formed in an array manner, and a plurality of substrates and dams may be connected by one time of electroplating, thereby forming an integral structure of a plurality of brackets 100. Then, each individual bracket 100 is separated from other brackets 100 to form a single bracket 100 for use, for example, packaging a light emitting diode wafer/chip, an optical lens, and so on.

For different manufacturing methods, the cutting manner is also different, which is specifically described below.

A first method for manufacturing the bracket for packaging a semiconductor device includes:

Step S11, providing a first component and a second component.

In the above, the first component has a plurality of ceramic substrates arranged in an array. A front surface of each ceramic substrate is electroplated to form a first metal plating layer, a back surface is provided with an external electroplating electrode in electrical communication with the first metal plating layer, and a surface layer material of the first metal plating layer is copper, nickel, gold or silver.

In the above, the second component has a plurality of ceramic enclosing plates arranged in an array. A surface of each ceramic enclosing plate is electroplated with a second metal plating layer, and a surface layer material of the second metal plating layer is copper, nickel, gold or silver.

Step S12, arranging the first component and the second component in a stacking manner (they may be in contact or not).

The first component and the second component are opposed to each other in such a manner that the first metal plating layer of each ceramic substrate and the second metal plating layer of each ceramic enclosing plate face each other, and meanwhile, an internal electroplating electrode electrically connected to the external electroplating electrode (electrical connection between the two may be realized through a conductive line penetrating through the ceramic substrate) is also provided between the first metal plating layer and the second metal plating layer.

Step S13, connecting a power supply through the external electroplating electrode, and electroplating copper, nickel, gold or silver, so as to form an electroplating layer between the first metal plating layer and the second metal plating layer to connect the two.

Step S14, cutting the first component and the second component connected through the electroplating layer after cutting the external electroplating electrode, so as to separately form a plurality of independent brackets composed of the ceramic substrate and the ceramic enclosing plate.

A second method of manufacturing the bracket for packaging a semiconductor device includes:

Step S21, providing a first component and a second component.

In the above, the first component has a plurality of ceramic substrates arranged in an array. A front surface of each ceramic substrate is plated with a first metal plating layer, and a surface layer material of the first metal plating layer is copper, nickel, gold or silver.

In the above, the second component has a plurality of ceramic enclosing plates arranged in an array. A front surface of each ceramic enclosing plate is plated with a second metal plating layer, a back surface is provided with an external electroplating electrode in electrical communication with the second metal plating layer, and the surface layer material of the second metal plating layer is copper, nickel, gold or silver.

Step S22, arranging the first component and the second component in a stacking manner (they may be in contact or not).

The first component and the second component are opposed to each other in such a manner that the first metal plating layer of each ceramic substrate and the second metal plating layer of each ceramic enclosing plate face each other, and meanwhile, an internal electroplating electrode electrically connected to the external electroplating electrode (electrical connection between the two may be realized through a conductive line penetrating through the ceramic substrate) is also provided between the first metal plating layer and the second metal plating layer.

Step S23, connecting a power supply through the external electroplating electrode, and electroplating copper, nickel, gold or silver, so as to form an electroplating layer between the first metal plating layer and the second metal plating layer to connect the two.

Step S24, cutting the whole of the first component and the second component connected through the electroplating layer, so as to separately form a plurality of independent brackets composed of the ceramic substrate and the ceramic enclosing plate.

Alternatively, in step S24, it also may be selected that only the second component is cut to form a plurality of independent brackets composed of the ceramic substrate and the ceramic enclosing plates. Then, the electroplating continues so as to enhance the electroplating connection strength between the first metal plating layer and the second metal plating layer.

The ceramic substrate and the ceramic enclosing plate in the foregoing step S11 and step S21 are manufactured in the foregoing manner, a conductive layer (such as electroless plating, deposition, and sintering) is formed on the surface of the ceramic matrix, and then the metal plating layer on the surface of the conductive layer is formed in an electroplating manner, which is not described herein again. Alternatively, the metal plating layer also may be manufactured only in a sputtering manner, for example, the (second) metal plating layer on the surface of the ceramic enclosing plate is deposited by sputtering.

In addition, the first metal plating layer and the second metal plating layer may be manufactured in a manner such as multiple times of electroplating, therefore, from a microscopic view or manufacturing process, the first metal plating layer and the second metal plating layer are multi-layer structures (that is, the two metal plating layers above both may have a plurality of sub-layers). In the present disclosure, the number of sub-layers, the thickness thereof, the material of each layer, and the process parameters thereof are not particularly defined, and they are comprehensively considered according to aspects such as operation convenience, cost reduction, improvement on quality and shortening of manufacturing cycle. However, the surface layer materials of the first metal plating layer and the second metal plating layer need to be properly considered, for example, the surface layer materials of both are independently selected from any one of copper, nickel, gold and silver, respectively.

The alignment fit between the ceramic substrate and the ceramic enclosing plate may be kept in a selected posture using a mechanical device such as a clamp, and then an electroplating tank placed with, for example, stored with an electroplating solution is connected to positive and negative poles of a power supply to performing the electroplating operation. Obviously, the first metal plating layer and the second metal plating layer serve as cathodes, so that metal ions of the plating layer are deposited and reduced on the surface thereof. In a specific electroplating operation, the two metal plating layers may be directly connected to the negative pole of the power supply, thereby allowing the electroplating metal ions to be deposited and reduced directly on the surface thereof. During the electroplating process, the formed electroplating material gradually adheres to the surfaces of the first metal plating layer and the second metal plating layer, and as the electroplating continues, the electroplating material gradually thickens, and finally fills between the two metal plating layers.

In some examples, the ceramic substrate and the ceramic enclosing plate are in contact with each other, that is, the first metal plating layer and the second metal plating layer are in contact with each other. Either or both are simultaneously connected to the negative pole of the power supply. Alternatively, in some examples, the two metal plating layers are spaced apart from each other by an appropriate distance, and the electroplating electrode is provided therebetween in a contact or non-contact manner. In this case, the electroplating electrode is connected to the negative pole of the power supply, and serves as a cathode for the adhesion of the electroplating material, and as the electroplating continues, the electroplating material gradually thickens and is bonded with the first metal plating layer and the second metal plating layer on two sides, thereby achieving the electroplating connection between the ceramic substrate and the ceramic enclosing plate. Obviously, in this example, the electroplating electrode is gradually adhered and covered by the electroplating material. Therefore, the electroplating electrode is bonded into the electroplating layer 103. Therefore, due to the presence of the electroplating electrode, the time of the electroplating operation may be suitably shortened, and the consumption of the electroplating material may be suitably reduced. Moreover, due to the presence of the electroplating electrode, the strength of the electroplating layer 103 further may be improved.

Figure 5:
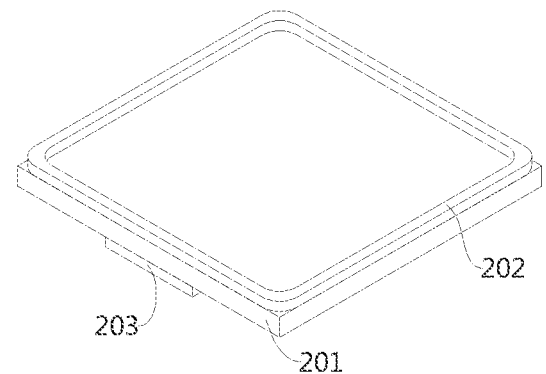
FIG. 5 is a structural schematic view of another second frame in an example of the present disclosure (having two electroplating electrodes)
Figure 6:
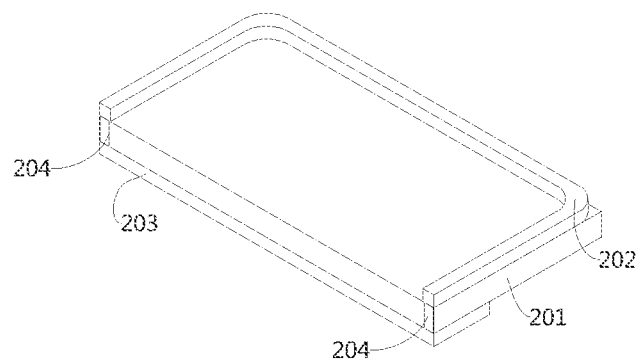
FIG. 6 shows a sectional structural schematic view of the bracket in FIG. 5.
Figure 7:
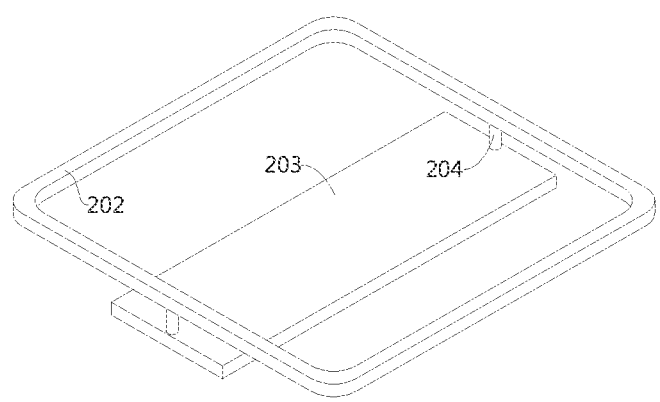
FIG. 7 shows a structural schematic view of cooperation between two electroplating electrodes in FIG. 5.
Figure 8:
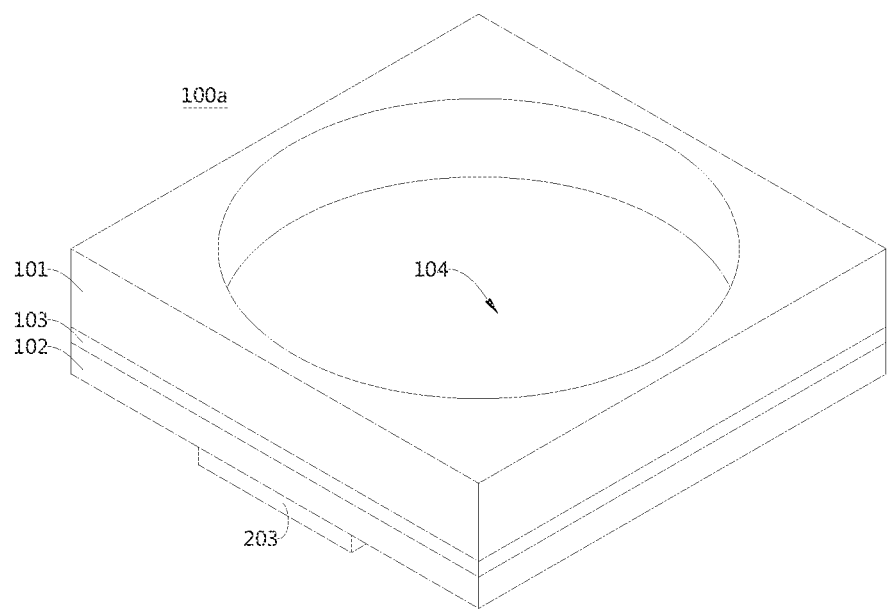
FIG. 8 is a structural schematic view of a second type of bracket provided in an example of the present disclosure.

It should be understood that the ceramic substrate in the above steps is the second frame 102 for forming the bracket 100; and the ceramic enclosing plate is the first frame 101 for forming the bracket 100. FIG. 5 is another structural schematic view of the second frame in an example of the present disclosure (having two electroplating electrodes); FIG. 6 shows a sectional structural schematic view of the bracket in FIG. 5; and FIG. 7 shows a structural schematic view of cooperation between two electroplating electrodes in FIG. 5. As shown in FIG. 5 to FIG. 7, further, in order to conveniently connect the power supply to perform the electroplating operation, another electroplating electrode (second electrode 203) may also be provided on the ceramic substrate 201, which serves as a power supply electrode, and supplies power to an electroplating electrode (first electrode 202) located between the first metal plating layer and the second metal plating layer, that is, the first electrode 202 and the second electrode 203 are in electrical communication with each other, so as to facilitate the electroplating operation. The structure of the bracket 100a based on this design is as shown in FIG. 8.

The communication mode may be realized by selective routing. For example, when the first electrode 202 and the second electrode 203 are respectively located on two sides of the ceramic substrate 201 in the thickness direction or two sides of the ceramic enclosing plate in the thickness direction, the two electrodes may realize electric connection/ electrical connection through a conductive post 204 in a through hole penetrating through the substrate and the enclosing plate in the thickness direction.

Certainly, the first electrode 202 and the second electrode 203 may also choose other arrangement manners, for example, the first electrode 202 is located between the first metal plating layer and the second metal plating layer, and the second electrode 203 is located at a side edge of the ceramic substrate 201 or a side edge of the ceramic enclosing plate. In addition, as an optional solution, there may be two sets of first electrode 202 and second electrode 203, i.e. two first electrodes 202 and two second electrodes 203. One set of first electrode 202 and second electrode 203 are arranged corresponding to the ceramic substrate 201, and the other set of first electrode 202 and second electrode 203 are arranged corresponding to the ceramic enclosing plate. For example, the two first electrodes 202 are located between the first metal plating layer and the second metal plating layer, and one of the second electrodes 203 is located on the back surface of the ceramic substrate 201, and the other second electrode 203 is located on the back surface of the ceramic enclosing plate (taking the sides of the ceramic substrate 201 and the ceramic enclosing plate facing each other as the front surfaces, that is, the surfaces having the first metal plating layer and the second metal plating layer).

In another optional solution, in the electroplating process, there are two electrodes, the first electrode 202 and the second electrode 203, for electroplating, wherein the first electrode 202 is bonded to the front surface of the ceramic substrate 201, and the second electrode 203 is bonded to the back surface of the ceramic substrate 201, and the two are electrically connected by the conductive post 204, referring to FIG. 5, FIG. 6 and FIG. 7. This may be implemented when manufacturing the ceramic substrate 201, thereby simplifying the electroplating operation. Therefore, in the structure of the bracket 100 thus manufactured, an electroplating electrode is included. In the above, the electroplating electrode located between the ceramic substrate 201 and the ceramic enclosing plate is bonded to the electroplating material (and therefore is not depicted), and the other electroplating electrode is located on the back surface of the ceramic substrate 201, referring to FIG. 8. It should be understood that the front surface of the ceramic substrate described in the embodiments of the present disclosure refers to a surface of the ceramic substrate facing the ceramic enclosing plate, and the back surface thereof is a surface opposite to the front surface and facing away from the ceramic enclosing plate; and the front surface and the back surface of the ceramic enclosing plate should also be understood similarly.

Figure 15:
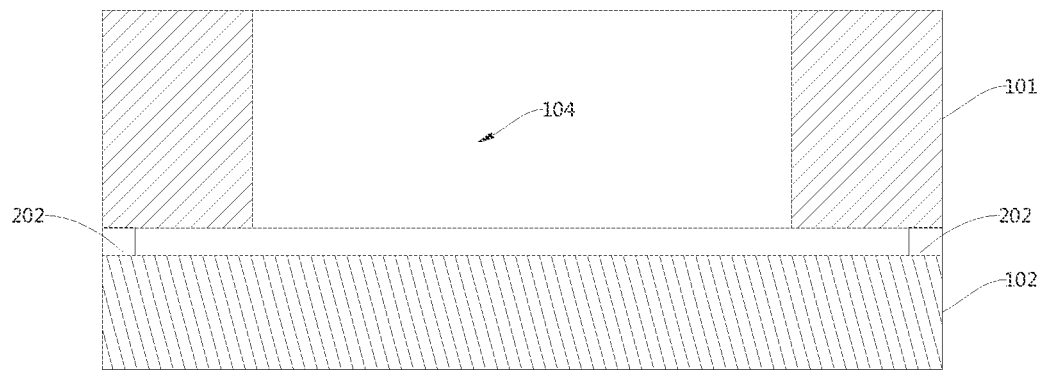
FIG. 15 shows a structural schematic view of a first configuration manner of the electroplating electrode in the bracket in an example of the present disclosure.
Figure 16:
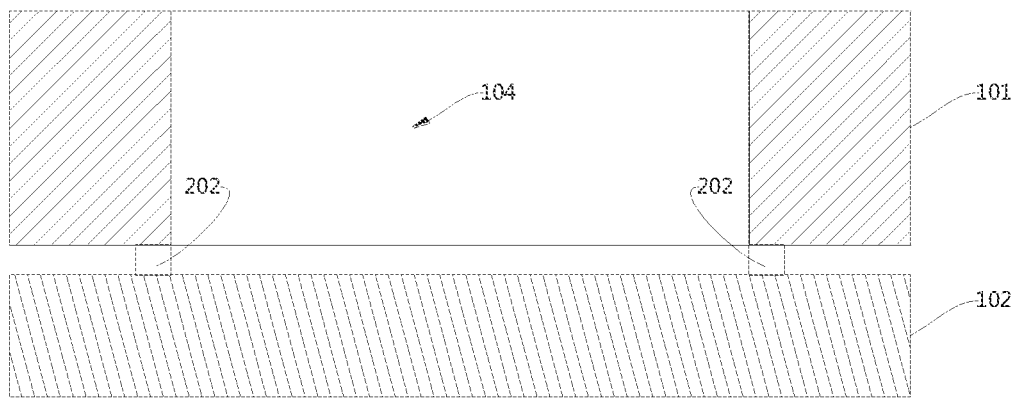
FIG. 16 shows a structural schematic view of a second configuration manner of the electroplating electrode in the bracket in an example of the present disclosure.
Figure 17:
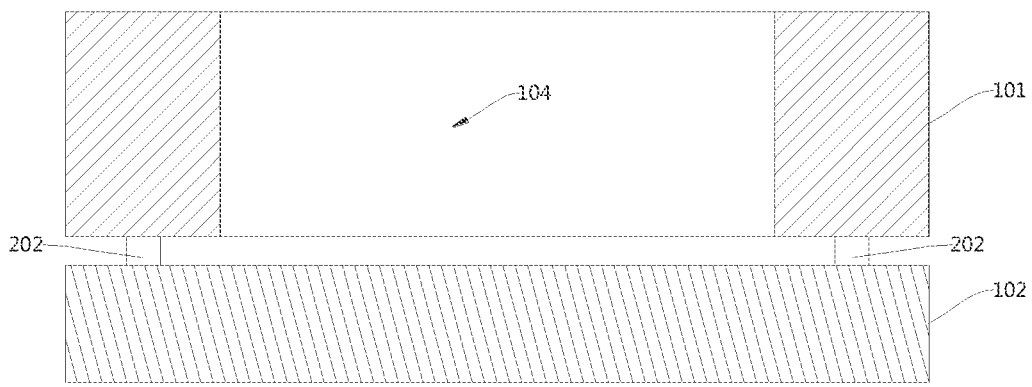
FIG. 17 shows a structural schematic view of a third configuration manner of the electroplating electrode in the bracket in an example of the present disclosure.

In some other examples, the position of the electroplating electrode arranged between the ceramic substrate 201 and the ceramic enclosing plate may be adjusted. For example, in the above FIG. 5, FIG. 6 and FIG. 7, the electroplating electrode (the first electrode 202) is located in an area on the ceramic substrate facing to the ceramic enclosing plate. In other words, the width of the electroplating electrode is equal to or substantially equivalent to the area where the ceramic substrate and the ceramic enclosing plate are in contact. As an alternative solution, the electroplating electrode is located at an edge of the ceramic substrate, therefore, the electroplating electrode only covers a part of the area where the ceramic substrate and the ceramic enclosing plate are in contact, i.e. the edge thereof. Moreover, the ceramic substrate and the ceramic enclosing plate are in contact through the electroplating electrode. As an example, the electroplating electrode may be located at an outer side edge (referring to FIG. 15) or an inner side edge (referring to FIG. 16), and further may even be located between two side edges (for example, in the middle, referring to FIG. 17).

Figure 18:
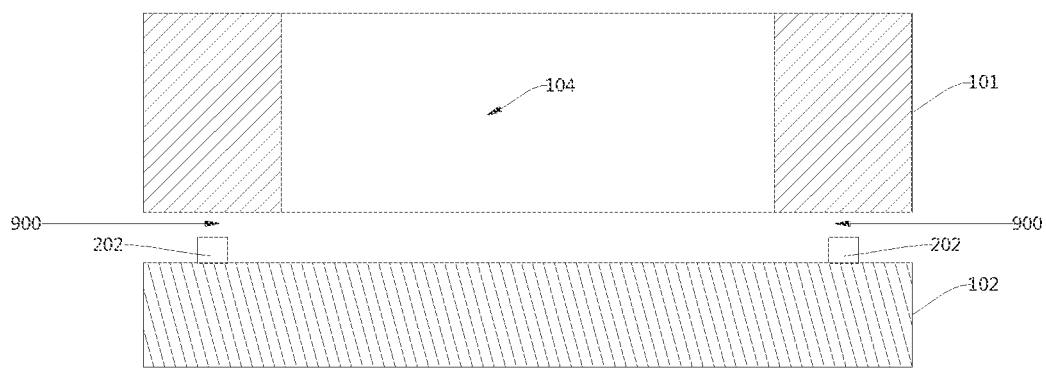
FIG. 18 shows a structural schematic view of a fourth configuration manner of the electroplating electrode in the bracket in an example of the present disclosure.

It should be noted that in the examples illustrated above (FIG. 15, FIG. 16 and FIG. 17), the first metal plating layer and the second metal plating layer respectively located on the ceramic substrate and the ceramic enclosing plate are not depicted. In addition, in the solution illustrated in the forgoing, the ceramic substrate is brought into contact with the ceramic enclosing plate through the electroplating electrode, but the electroplating electrode may also be selected to be provided on the ceramic substrate, and meanwhile, the electroplating electrode and the ceramic enclosing plate have an appropriate narrow slit 900 therebetween, referring to FIG. 18.

Figure 19:
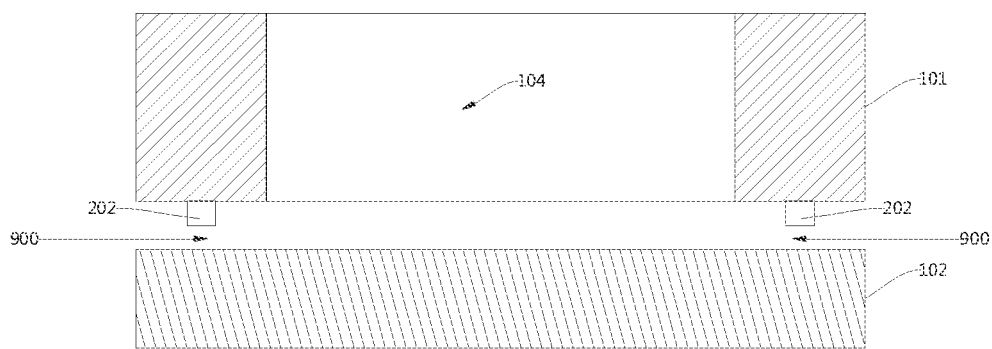
FIG. 19 shows a structural schematic view of a fifth configuration manner of the electroplating electrode in the bracket in an example of the present disclosure.

In addition, the electroplating electrode may also be disposed on the ceramic enclosing plate, and meanwhile, the electroplating electrode and the ceramic enclosing plate have an appropriate narrow slit 900 therebetween (for example, FIG. 19) or are in direct contact through the electroplating electrode. Moreover, in FIG. 19, the electroplating electrode is located in the middle of the ceramic enclosing plate, and may also be located at an outer side edge or an inner side edge thereof.

In the above example, another electroplating electrode (second electrode 203) in electrical communication with the electroplating electrode (first electrode 202) may be independently selected to be provided on the ceramic enclosing plate or the ceramic substrate (referring to FIG. 8).

Based on this, when the bracket 100 is manufactured, the ceramic substrate 201 may be manufactured and processed in advance. For example, a first electroplating electrode is manufactured on the front surface of the ceramic substrate 201 having the first metal plating layer (the surface of the first metal plating layer) in a manner of electroplating or deposition. Then, the first conductive post 204 is formed therethrough on the ceramic substrate 201. Then a second electroplating electrode is manufactured on the back surface of the ceramic substrate 201, and is electrically connected to the first electroplating electrode through the first conductive post 204. The number of conductive posts 204 may be appropriately selected depending on different needs. As shown in FIG. 7, two conductive posts 204 are provided, therefore, in addition to the first conductive post, a second conductive post is included. The two conductive posts 204 are provided in the same manner, and are both electrically connected to the first electroplating electrode on the front.

In these solutions, the ceramic substrate 201 has two electroplating electrodes connected to the two conductive posts 204, respectively. Therefore, it may be seen that the ceramic substrate 201 has two through holes. When there are a plurality of conductive posts 204, the ceramic substrate 201 correspondingly also has a plurality of through holes.

Figure 9:
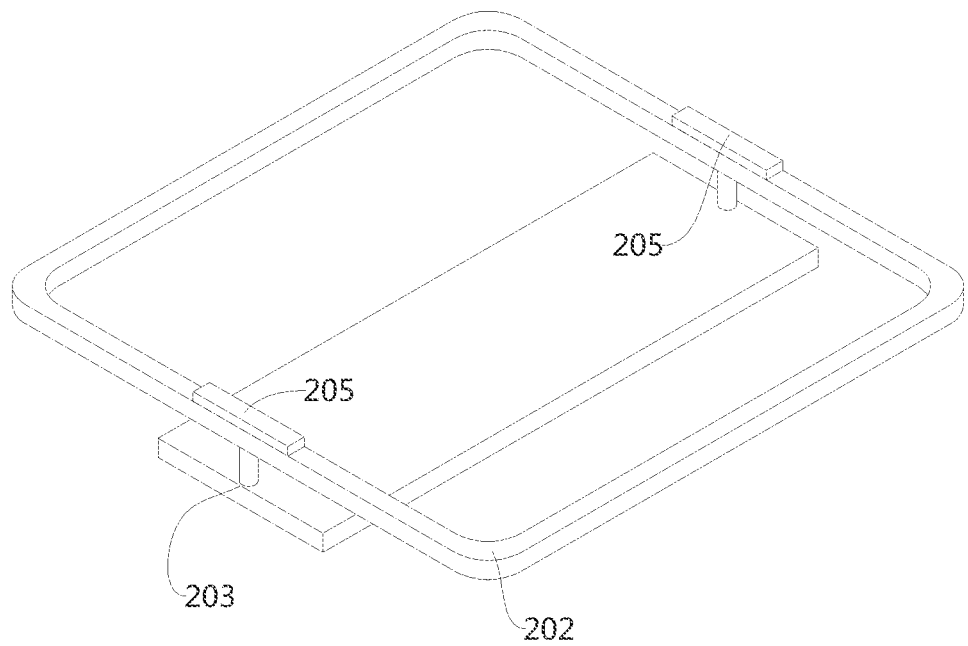
FIG. 9 is another structural schematic view of cooperation between two electroplating electrodes (one of the electroplating electrodes has a protrusion)
Figure 10:
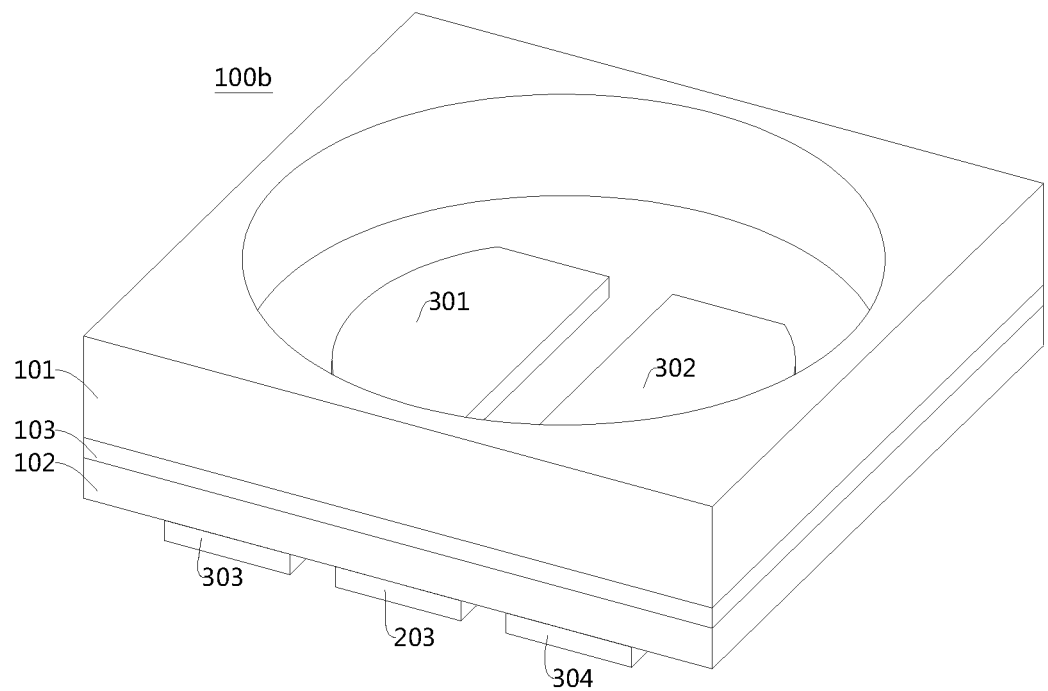
FIG. 10 is a structural schematic view of a third type of bracket provided in an example of the present disclosure in a first perspective.
Figure 11:
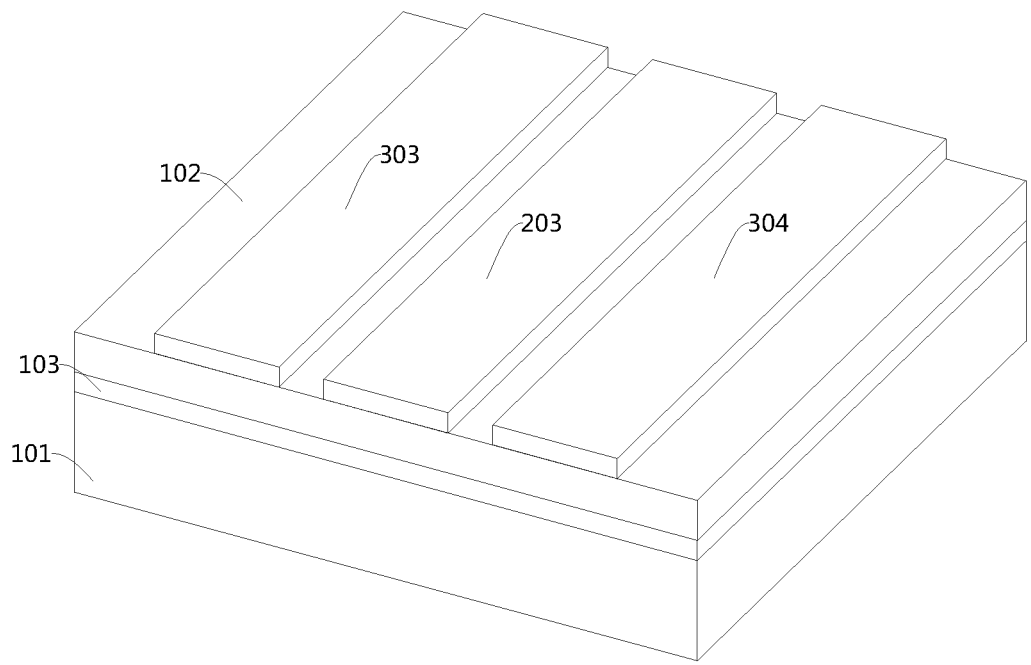
FIG. 11 is a structural schematic view of the third type of bracket provided in an example of the present disclosure in a second perspective.
Figure 12:
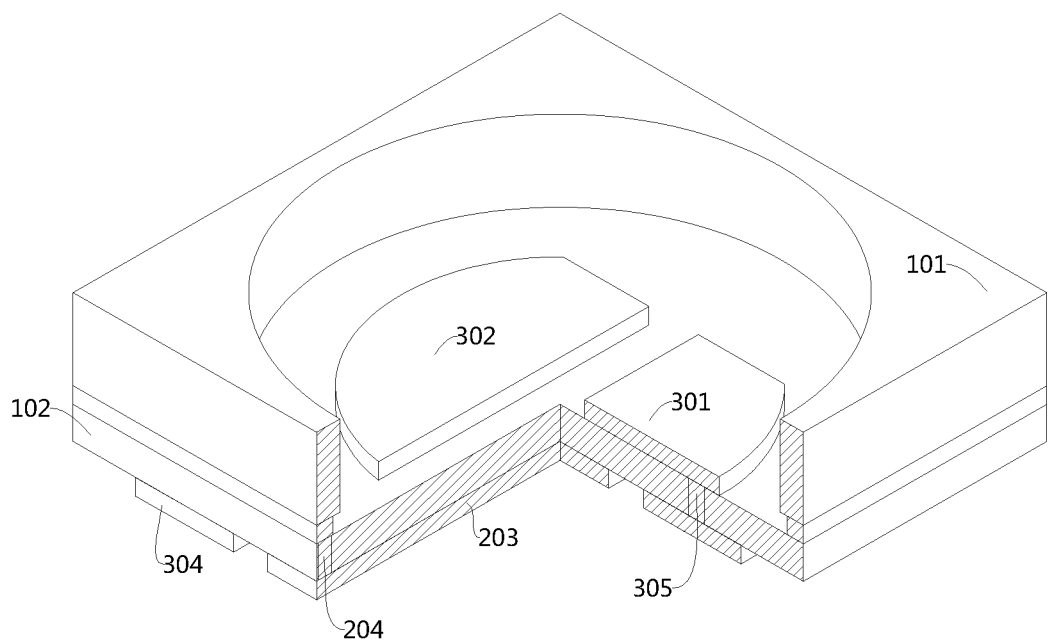
FIG. 12 is a half-sectional structural schematic view of the third type of bracket provided in an example of the present disclosure.

In addition, as described above, another type of bracket 100 has a spacer, therefore, in connection with the above solution with two electroplating electrodes, a protrusion 205 may be formed on the surface of the first electrode 202, and a spacer structure is provided by the protrusion 205. Referring to FIG. 9, with the spacer structure provided by the electroplating electrode, a complex operation of separately providing an isolation structure may be avoided during the electroplating process, and meanwhile, it further may limit the distance between the substrate and the enclosing plate, so that the thickness of the electroplating layer 103 may be controlled, and it may also play a conductive function (when it is chosen to use a conductive material). The bracket 100b manufactured by forming the protrusion 205 on the surface of the first electrode 202 is illustrated in FIG. 10, FIG. 11 and FIG. 12.

In the above example, illustration is made in a manner of providing the two electroplating electrodes both on the ceramic substrate 201, and in some other examples, the above two electroplating electrodes may also be provided on the ceramic enclosing plate, or the ceramic substrate 201 and the ceramic enclosing plate may be simultaneously provided with two electroplating electrodes and/or protrusions 205 respectively according to the foregoing manner, which will not be described in detail herein. In the above, the manufacturing of the bracket 100 is facilitated by providing the electroplating electrodes in the ceramic substrate 201 and the ceramic enclosing plate, and in other examples, it also may be selected to manufacture the electrode to serve as the power supply electrode when the light emitting diode is manufactured using the bracket 100.

For example, the ceramic substrate 201 (or the second ceramic matrix 1021 in the second frame 102 above) has a positive electrode 303 and a negative electrode 304, and both are located on the back surface of the ceramic substrate 201. Meanwhile, two chip electrodes (such as a first internal electrode 301 and a second internal electrode 302 in FIG. 10) are provided in the ceramic enclosing plate (or the first ceramic matrix 1011 in the first frame 101 above), and the positive electrode 303 is electrically connected to one of the chip electrodes (the first internal electrode 301), and the negative electrode 304 is electrically connected to the other chip electrode (the second internal electrode 302) therein.

The two chip electrodes are electrically connected to the positive electrode 303 and the negative electrode 304, respectively. In the above, the two chip electrodes are connected to the diode light emitting chip, and connected to two poles of the power supply through the positive electrode 303 and the negative electrode 304.

In general, both upper and lower surfaces of the ceramic substrate may be respectively fabricated as electrodes for supplying power to the chip. For example, a first chip power supply electrode (i.e. the first internal electrode 301 above, which is directly electrically connected to, for example, an LED light emitting chip) is fabricated on the surface of the ceramic substrate, and a second chip power supply electrode (i.e. the positive electrode 303 above, which may be electrically connected to the power supply) is fabricated on the back surface of the ceramic substrate. The first chip power supply electrode and the second chip power supply electrode may be in electrical communication, and form a power supply circuit, for example, a positive circuit. Meanwhile, it may be understood that, in order to form a current loop, another power supply circuit as described above may also be provided, which may serve as a negative circuit.

It should be noted that the first chip power supply electrode above is located in an area of the ceramic substrate where the first metal plating layer is not provided—a chosen area of the front surface, that is, a position reserved on the ceramic substrate for placing, for example, an LED light emitting chip. The position of the second chip power supply electrode may be the back surface of the "ceramic substrate" above, or may be various positions such as a side surface of the ceramic substrate selected according to fabrication and use convenience.

In addition, the electrical connection manner between the chip electrode and the positive electrode 303 and the negative electrode 304 may be as follows: the second ceramic matrix 1021 has a hole, the hole is filled with the conductive connecting post 305 (or referred to as a chip power supply conductive post), and two ends of one conductive connecting post 305 are electrically connected to the chip electrode and the positive electrode 303 respectively, two ends of another conductive connecting post 305 are electrically connected to the chip electrode and the positive electrode 303, respectively.

Figure 13:
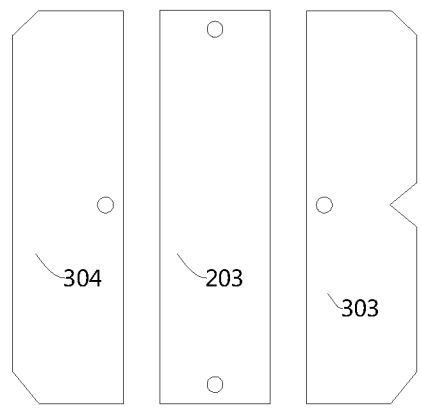
FIG. 13 shows a schematic view of a first distribution manner of a positive electrode, a negative electrode and a conductive post and a conductive connecting post in the electroplating electrode in the bracket of FIG. 10.
Figure 14:
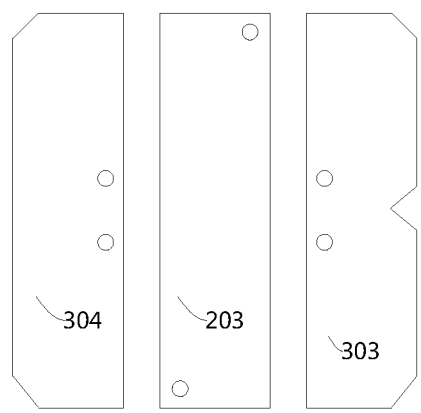
FIG. 14 shows a schematic view of a second distribution manner of the positive electrode, the negative electrode and the conductive post and the conductive connecting post in the electroplating electrode in the bracket of FIG. 10.

In FIG. 12, a connecting line (first connecting line) electrically connecting the conductive posts 204 of two electroplating electrodes and a connecting line (second connecting line) electrically connecting the conductive connecting posts 305 of the chip electrode and the positive electrode 303 (negative electrode 304) are arranged orthogonally. In other examples, the first connecting line and the second connecting line above also may be arranged at other angles, that is, at an inclination angle. Moreover, the number of conductive posts 204 may be not only two, but may also be more than two; the conductive connecting posts 305 may be not only two, but may also be more than two, referring to FIG. 13 and FIG. 14. Correspondingly, the number of holes and through holes for placing the conductive posts 204 and the conductive connecting posts 305 may be adaptively set.

In addition, the example further provides an application example of the bracket 100, i.e. a packaging structure. The packaging structure includes the bracket 100, a semiconductor chip and a transparent material. The semiconductor chip is, for example, a deep ultraviolet light emitting diode chip, which is fixed in the cavity 104 of the bracket 100, for example, by eutectic welding, tin paste welding, silver paste sticking, silica gel sticking or in other manners. Two electrodes of the deep ultraviolet light emitting diode chip are electrically connected to the two chip electrodes in the cavity 104 respectively. A package body may be an optical lens embedded in the cavity 104 and secured to the bracket 100 (for example, the optical lens is selected as glass—quartz glass, sapphire or high borosilicate glass, connected by welding). It should be noted that, in the deep ultraviolet light emitting diode, the organic glue has poor ultraviolet resistance and poor temperature resistance, therefore, the inorganic glue cannot be selected for the optical lens above. In other words, after the light emitting chip is mounted in the bracket, inorganic packaging is selected.

Further, based on the light emitting diode manufactured by the packaging structure, various suitable semiconductor devices such as a deep ultraviolet light emitting diode lamp may be manufactured. Further, in some electronic devices, the foregoing packaging structure further may be used. For example, in some devices such as LED lighting devices or display devices with liquid crystal display screen, a light source or backlight may be an LED light emitting chip packaged with the packaging structure in the example of the present disclosure.

In the description of the present disclosure, it should be noted that orientation or positional relationships indicated by terms such as "upper", "lower", "inner", and "outer" are based on orientation or positional relationships as shown in the figures, or orientation or positional relationships of a product of the present disclosure when being conventionally placed in use, merely for facilitating describing the present disclosure and simplifying the description, rather than indicating or suggesting that related devices or elements have to be in the specific orientation or configured and operated in a specific orientation, therefore, they should not be construed as limiting the present disclosure. Besides, terms such as "first" and "second" are merely used for distinctive description, but should not be construed as indicating or implying importance in the relativity. In the description of the present disclosure, it should be further noted that, unless otherwise specifically regulated and defined, the terms "set", "install", "link", and "connect" should be understood in a broad sense, for example, connection may be fixed connection, detachable connection, or integrated connection; it may be mechanical connection or electrical connection; it may be direct joining or indirect joining through an intermediary, and it also may be inner communication between two elements. For those ordinarily skilled in the art, specific meanings of the above-mentioned terms in the present disclosure could be understood according to specific circumstances.

The above-mentioned are merely for certain examples of the present disclosure and not used to limit the present disclosure. For one skilled in the art, various modifications and changes may be made to the present disclosure. Any modifications, equivalent substitutions, improvements and so on, within the spirit and principle of the present disclosure, should be covered within the scope of protection of the present disclosure.

The bracket provided in the present disclosure can withstand a relatively high operating temperature and process temperature, and thus can be a longer service life and lower manufacturing costs. The packaging structure, the semiconductor device, and the electronic equipment including this bracket can also have the characteristics of a long service life and low manufacturing costs correspondingly. The manufacturing method provided in the present disclosure can be used for manufacturing the bracket stably at relatively low costs.

What is claimed is:

1. A bracket, wherein the bracket comprises:
   a first frame, comprising a first ceramic matrix and a first metal cladding layer on a surface of the first ceramic matrix;
   a second frame, placed opposite to the first frame and comprising a second ceramic matrix and a second metal cladding layer on a surface of the second ceramic matrix; and
   an electroplating layer, located between the first frame and the second frame that are placed opposite to each other, and connected respectively to the first metal cladding layer and the second metal cladding layer by electroplating.

2. The bracket according to claim 1, wherein the bracket is configured as any one or more of following situations, wherein
   in a first situation, a thickness of the first ceramic matrix is between 0.2 mm and 1.5 mm;
   in a second situation, a thickness of the second ceramic matrix is less than or equal to 1.0 mm;
   in a third situation, a coefficient of thermal expansion of the first frame is consistent with or close to a coefficient of thermal expansion of the second frame;
   in a fourth situation, the bracket has an operating duration more than or equal to 5 minutes under a condition that an operating temperature reaches 250° C. to 400° C.;
   in a fifth situation, the bracket is capable of continuously operating in an environment of alternate high and low temperatures with a temperature difference of 50~200° C.;
   in a sixth situation, the first metal cladding layer and the second metal cladding layer are both flat or uneven, and/or the first ceramic matrix and the second ceramic matrix are configured to be flat or uneven, respectively; and
   in a seventh situation, a metal material between the first ceramic matrix and the second ceramic matrix comprises the first metal cladding layer, the second metal cladding layer and an electroplating metal layer, and a total thickness of the metal material is not more than 100 μm.

3. The bracket according to claim 2, wherein at least one of the following: a spacer is provided between the first metal cladding layer and the second metal cladding layer; or
   the spacer is located between the first metal cladding layer and the electroplating layer; or
   a thickness of the spacer is less than 80 μm; or
   a thickness of the spacer is less than 70 μm; or
   the spacer is made of metal or non-metal; or
   the spacer is bonded into the electroplating layer.

4. The bracket according to claim 1, wherein a spacer is provided between the first metal cladding layer and the second metal cladding layer; or
   the spacer is located between the first metal cladding layer and the electroplating layer; and/or
   a thickness of the spacer is less than 80 μm; and/or
   a thickness of the spacer is less than 70 μm; and/or
   the spacer is made of metal or non-metal; or
   the spacer is bonded into the electroplating layer.

5. The bracket according to claim 2, wherein the first metal cladding layer and the second metal cladding layer are connected through the electroplating layer directly by electroplating.

6. The bracket according to claim 4, wherein the bracket has an electroplating electrode, and the electroplating electrode is electrically connected to the electroplating layer; or
   the bracket has an electroplating electrode bonded to the second ceramic matrix, the second ceramic matrix has a through hole and a conductive post filled in the through hole, and the electroplating electrode is electrically connected to the electroplating layer through the conductive post.

7. The bracket according to claim 4, wherein the bracket has an electroplating electrode bonded to the second ceramic matrix, the second ceramic matrix has two electroplating through holes and two conductive posts respectively filled in the two electroplating through holes, and the electroplating electrode is electrically connected to the electroplating layer through the two conductive posts; and the second ceramic matrix has a positive electrode and a negative electrode, wherein the positive electrode has a positive through hole, the negative electrode has a negative through hole, and a connecting line between the positive through hole and the negative through hole is orthogonal to a connecting line between the two electroplating through holes, or forms an inclined angle with a connecting line between the positive electrode and the negative electrode; or the electroplating electrode is located at an edge of the second ceramic matrix.

8. The bracket according to claim 1, wherein the first metal cladding layer and the second metal cladding layer are connected through the electroplating layer directly by electroplating.

9. The bracket according to claim 1, wherein the bracket has an electroplating electrode, and the electroplating electrode is electrically connected to the electroplating layer; or the bracket has an electroplating electrode bonded to the second ceramic matrix, the second ceramic matrix has a through hole and a conductive post filled in the through hole, and the electroplating electrode is electrically connected to the electroplating layer through the conductive post.

10. The bracket according to claim 1, wherein the bracket has an electroplating electrode bonded to the second ceramic matrix, the second ceramic matrix has two electroplating through holes and two conductive posts respectively filled in the two electroplating through holes, and the electroplating electrode is electrically connected to the electroplating layer through the two conductive posts; and the second ceramic matrix has a positive electrode and a negative electrode, wherein the positive electrode has a positive through hole, the negative electrode has a negative through hole, and a connecting line between the positive through hole and the negative through hole is orthogonal to a connecting line between the two electroplating through holes, or forms an inclined angle with a connecting line between the positive electrode and the negative electrode; or the electroplating electrode is located at an edge of the second ceramic matrix.

11. The bracket according to claim 1, wherein a material of the first ceramic matrix and a material of the second ceramic matrix are any one respectively independently selected from the group consisting of aluminum nitride, aluminum oxide, zirconium oxide, beryllium oxide, silicon carbide, boron nitride, silicon nitride, and zirconium oxide toughened aluminum oxide ceramic.

12. A method for manufacturing a bracket, wherein the method comprises:

providing a ceramic substrate, wherein a surface of the ceramic substrate is plated with a first metal plating layer;

providing a ceramic enclosing plate, wherein a surface of the ceramic enclosing plate is plated with a second metal plating layer; and electroplating the ceramic substrate and the ceramic enclosing plate in an alignment fit state, so as to form an electroplating layer between the first metal plating layer and the second metal plating layer to connect the two layers.

13. The method according to claim 12, wherein an alignment fit between the ceramic substrate and the ceramic enclosing plate is realized in a manner of bringing the first metal plating layer and the second metal plating layer into partial contact; or a surface layer material of the first metal plating layer is copper, nickel, gold or silver, or a surface layer material of the second metal plating layer is copper, nickel, gold or silver.

14. The method according to claim 12, wherein an alignment fit between the ceramic substrate and the ceramic enclosing plate is realized in a manner of making a distance between the first metal plating layer and the second metal plating layer reach a given distance and providing a spacer between the first metal plating layer and the second metal plating layer, wherein the given distance is within 80 mm or 70 mm; or the spacer is in contact with one or both of the first metal plating layer and the second metal plating layer; or the spacer is not in contact with each of the first metal plating layer and the second metal plating layer.

15. The method according to claim 12, wherein a method for providing the ceramic substrate comprises:

manufacturing a first electroplating electrode having a protrusion on a surface of the first metal plating layer;

providing a first conductive post penetrating through the ceramic substrate; and providing a second electroplating electrode on the ceramic substrate, so as to be in electrical communication with the first electroplating electrode through the first conductive post.

16. The method according to claim 12, wherein a method for providing the ceramic substrate comprises:

manufacturing a first chip power supply electrode configured to be in electrical connection with a semiconductor device on a surface of the ceramic substrate;

providing a chip power supply conductive post penetrating through the ceramic substrate; and providing, on the ceramic substrate, a second chip power supply electrode that is in electrical communication with the first chip power supply electrode through the chip power supply conductive post.

17. The method according to claim 12, wherein after the electroplating, the method comprises:

a step of cutting a dam; or a step of cutting a dam, wherein the step of cutting is realized by means of laser or mechanical cutting; or a step of cutting a dam, wherein after the dam is cut, electroplating is performed so as to enhance electroplating connection strength between the first metal plating layer and the second metal plating layer.

18. The method according to claim 12, the copper, nickel, gold or silver is electroplated onto the ceramic substrate and the ceramic enclosing plate in the alignment fit state, wherein in the electroplating, an electroplating energizing mode comprises:

providing an electroplating electrode on a surface of the ceramic enclosing plate facing to the ceramic substrate and supplying power by the electroplating electrode, to perform electroplating; or providing an electroplating electrode on a surface of the ceramic substrate facing to the ceramic enclosing plate and supplying power by the electroplating electrode, to perform electroplating; or providing an internal electroplating electrode and an external electroplating electrode electrically connected with each other on the ceramic substrate, and supplying power by the external electroplating electrode, to perform electroplating, wherein the internal electroplating electrode is located on the surface of the ceramic substrate facing to the ceramic enclosing plate, and the external electroplating electrode is located on a surface of the ceramic substrate facing away from the ceramic enclosing plate.

19. A method for manufacturing a bracket for packaging a semiconductor device, wherein the method comprises:
   providing a first component having a plurality of ceramic substrates arranged in an array, wherein a front surface of each of the ceramic substrates is plated with a first metal plating layer, and a surface layer material of the first metal plating layer is copper, nickel, gold or silver;
   providing a second component having a plurality of ceramic enclosing plates arranged in an array, wherein a front surface of each of the ceramic enclosing plates is plated with a second metal plating layer, a back surface is provided with an external electroplating electrode in electrical communication with the second metal plating layer, and a surface layer material of the second metal plating layer is copper, nickel, gold or silver;
   aligning the first component and the second component in a manner of bringing the first metal plating layer of each of the ceramic substrates and the second metal plating layer of each of the ceramic enclosing plates to face each other, and providing an internal electroplating electrode in electrical connection with the external electroplating electrode between the first metal plating layer and the second metal plating layer;
   connecting to a power supply through the external electroplating electrode, to perform electroplating, so as to form an electroplating layer between the first metal plating layer and the second metal plating layer to connect the two layers; and
   cutting the second component which is connected through the electroplating layer, so as to form a plurality of independent brackets composed of the ceramic substrate and the ceramic enclosing plate.

20. The method according to claim 19, wherein the method comprises:
   continuously performing electroplating after cutting the second component, so as to enhance an electroplating connection between the first metal plating layer and the second metal plating layer.

* * * * *